(12) United States Patent
Hitomi et al.

(10) Patent No.: US 11,626,266 B2
(45) Date of Patent: Apr. 11, 2023

(54) CHARGED PARTICLE BEAM DEVICE

(71) Applicant: Hitachi High-Tech Corporation, Tokyo (JP)

(72) Inventors: Keiichiro Hitomi, Tokyo (JP); Kenji Tanimoto, Tokyo (JP); Yusuke Abe, Tokyo (JP); Takuma Yamamoto, Tokyo (JP); Kei Sakai, Tokyo (JP); Satoru Yamaguchi, Tokyo (JP); Yasunori Goto, Tokyo (JP); Shuuichirou Takahashi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 34 days.

(21) Appl. No.: 17/501,249

(22) Filed: Oct. 14, 2021

(65) Prior Publication Data
US 2022/0130638 A1    Apr. 28, 2022

(30) Foreign Application Priority Data
Oct. 28, 2020 (JP) .............................. JP2020-180096

(51) Int. Cl.
*H01J 37/22* (2006.01)
*H01J 37/21* (2006.01)
*H01J 37/147* (2006.01)

(52) U.S. Cl.
CPC ........ *H01J 37/222* (2013.01); *H01J 37/1472* (2013.01); *H01J 37/21* (2013.01)

(58) Field of Classification Search
CPC .. H01J 37/00; H01J 37/02; H01J 37/22; H01J 37/21; H01J 37/222; H01J 37/1472; H01J 37/1478; H01J 37/10; H01J 37/147; H01J 37/26; H01J 37/28; H01J 2237/216
USPC .......................................... 250/306, 307, 311
See application file for complete search history.

(56) References Cited

U.S. PATENT DOCUMENTS

2006/0145087 A1* 7/2006 Parker ...................... H01J 9/42
                                                                    250/396 R
2016/0217967 A1* 7/2016 Dohi ................... H01J 37/1472

FOREIGN PATENT DOCUMENTS

JP          5502622 B2    5/2014

* cited by examiner

*Primary Examiner* — Jason L McCormack
(74) *Attorney, Agent, or Firm* — Volpe Koenig

(57) ABSTRACT

Provided is a charged particle beam device capable of focusing with high accuracy even when a charged particle beam has a large off-axis amount. The charged particle beam device generates an observation image of a sample by irradiating the sample with a charged particle beam, and includes: a deflection unit that inclines the charged particle beam; a focusing lens that focuses the charged particle beam; an adjustment unit that adjusts a lens strength of the focusing lens based on an evaluation value calculated from the observation image; a storage unit that stores a relationship between a visual field movement amount and the lens strength; and a filter setting unit that calculates the visual field movement amount based on an inclination angle of the charged particle beam and the relationship, and sets an image filter to be superimposed on the observation image based on the calculated visual field movement amount.

7 Claims, 9 Drawing Sheets

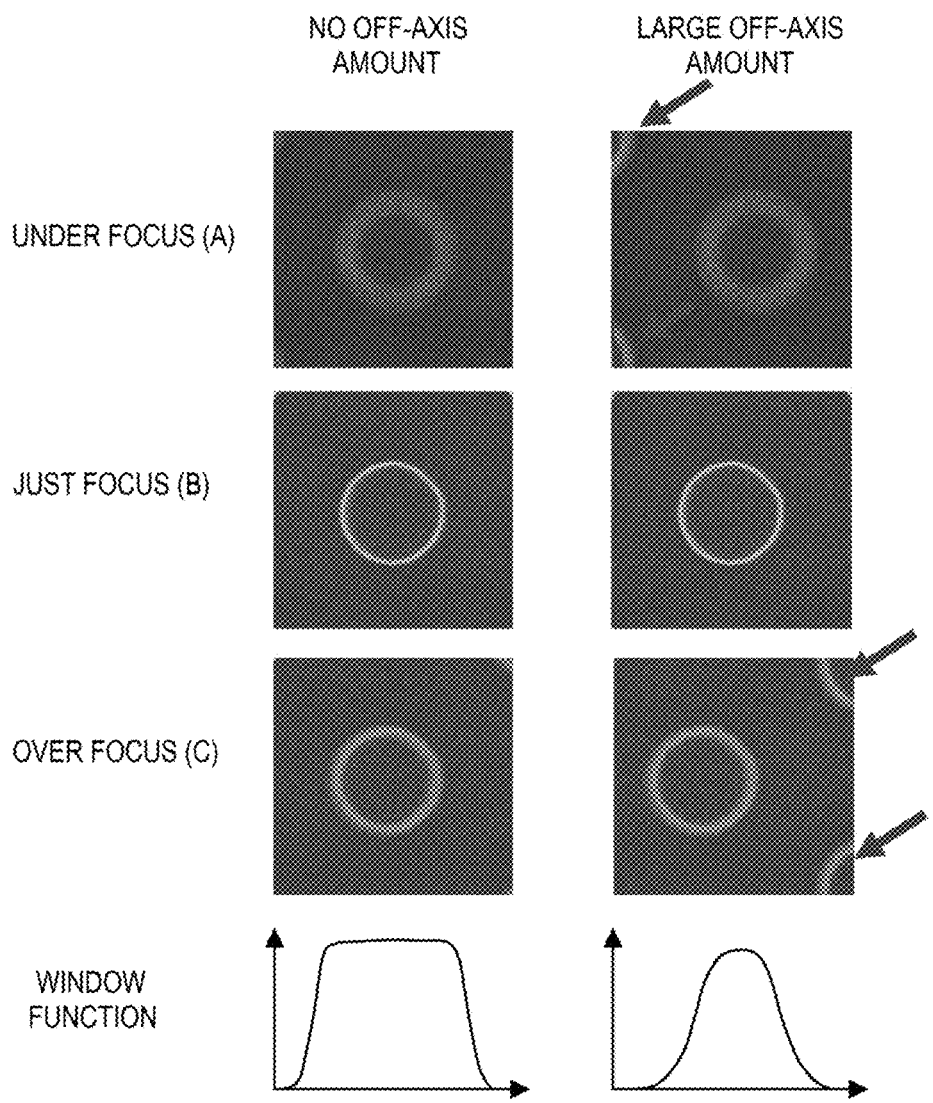

CHARGED PARTICLE BEAM DEVICE

CLAIM OF PRIORITY

The present application claims priority from Japanese Patent Application JP 2020-180096, filed on Oct. 28, 2020, the content of which are hereby incorporated by references into this application.

BACKGROUND OF THE INVENTION

1. Field of the Invention

The present invention relates to a charged particle beam device, and more particularly to a technique for observing a sample while inclining a charged particle beam irradiated to the sample.

2. Description of the Related Art

A charged particle beam device generates an observation image for observing a fine structure of a sample by irradiating the sample with a charged particle beam such as an electron beam, and is used in a semiconductor manufacturing process or the like. In the semiconductor manufacturing process, a sample may be irradiated with a charged particle beam in an inclined manner so that a semiconductor pattern can be observed not only from directly above but also from an oblique direction.

In addition, a large amount of charged particle beam devices are provided with a function of automatically focusing on a charged particle beam in order to simplify an operation related to observation. For example, focusing is performed by adjusting a lens strength of a focusing lens, so that sharpness of the observation image is maximized. Further, a visual field movement amount is calculated from the observation images before and after the electron beam with which the sample is irradiated is inclined, and focusing is performed based on a defocus amount calculated from an inclination angle of the electron beam and the visual field movement amount.

Japanese Patent No. 5502622 (PTL 1) discloses a method for enabling excellent focusing even when there is a hysteresis in an objective lens. Specifically, it is disclosed that three visual field movement amounts before and after inclining an electron beam irradiated to a sample are acquired while changing an excitation current of the objective lens, and focusing is performed based on the acquired three visual field movement amounts.

SUMMARY OF THE INVENTION

However, PTL 1 does not consider an influence of an off-axis amount, which is an amount of the inclined electron beam moving away from a center of the objective lens. Since the visual field movement amount increases according to the off-axis amount of the charged particle beam such as the electron beam, the accuracy may decrease in focusing based on only the visual field movement amounts acquired while changing the excitation current of the objective lens.

Therefore, an object of the invention is to provide a charged particle beam device capable of focusing with high accuracy even when a charged particle beam has a large off-axis amount.

In order to achieve the above object, the invention provides a charged particle beam device that generates an observation image of the sample by irradiating the sample with a charged particle beam, and the charged particle beam device includes: a deflection unit that inclines the charged particle beam; a focusing lens that focuses the charged particle beam; an adjustment unit that adjusts a lens strength of the focusing lens based on an evaluation value calculated from the observation image; a storage unit that stores a relationship between a visual field movement amount, which is an amount of movement of the charged particle beam on the sample for each off-axis amount that is an amount of the charged particle beam moving away from a center of the focusing lens, and the lens strength; and a filter setting unit that calculates the visual field movement amount based on an inclination angle of the charged particle beam and the relationship, and sets an image filter to be superimposed on the observation image based on the calculated visual field movement amount, in which the evaluation value is calculated from a superimposed image obtained by superimposing the image filter on the observation image.

According to the invention, it is possible to provide a charged particle beam device capable of focusing with high accuracy even when a charged particle beam has a large off-axis amount.

BRIEF DESCRIPTION OF THE DRAWINGS

FIG. 9 is a diagram showing the image filter according to the second embodiment.

DESCRIPTION OF THE PREFERRED EMBODIMENTS

Hereinafter, embodiments of a charged particle beam device in the invention will be described with reference to the accompanying drawings. The charged particle beam device generates an observation image for observing a sample by irradiating the sample with a charged particle beam. Hereinafter, as an example of the charged particle beam device, a scanning electron microscope (SEM) that generates the observation image by scanning the sample with an electron beam will be described.

First Embodiment

Figure 1:
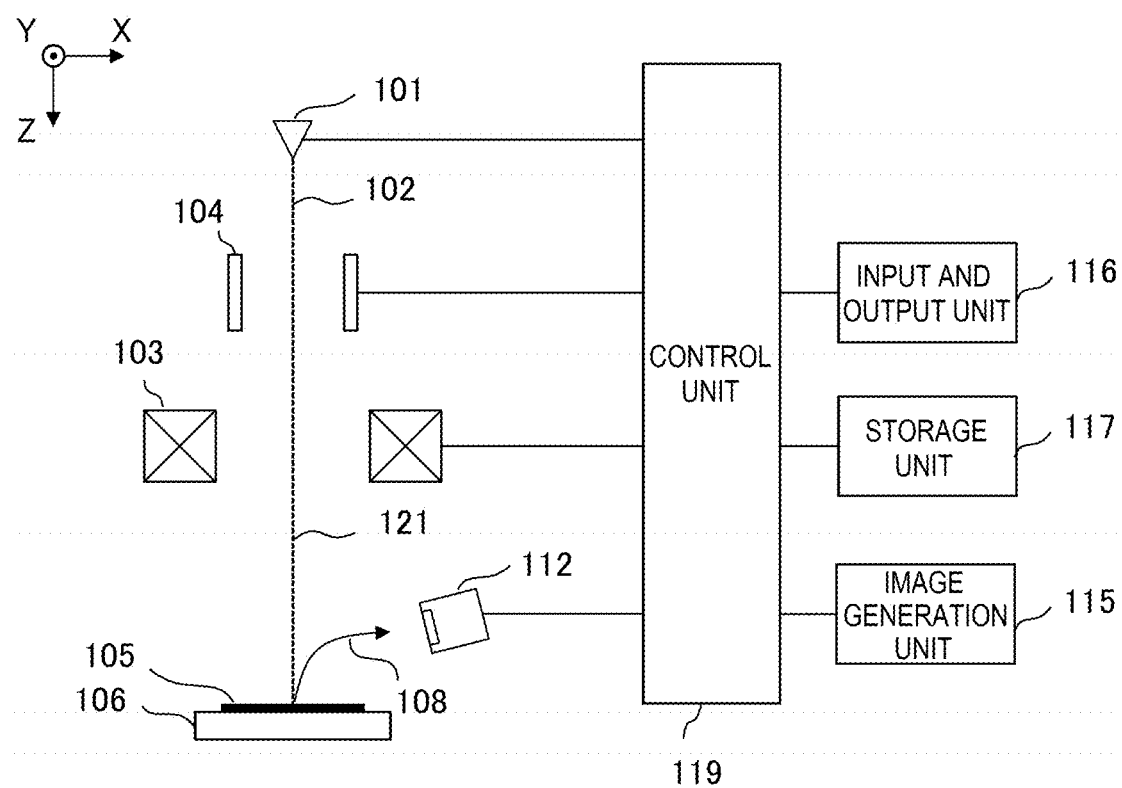
FIG. 1 is a schematic view of an example of a scanning electron microscope according to a first embodiment.

An overall configuration of the SEM according to the present embodiment will be described with reference to FIG. 1. In FIG. 1, a vertical direction is defined as a Z direction, and horizontal directions are defined as an X direction and a Y direction. The SEM includes an electron beam source 101, an objective lens 103, a deflector 104, a movable stage 106, a detector 112, an image generation unit 115, an input and output unit 116, a storage unit 117, and a control unit 119. Hereinafter, each unit will be described.

The electron beam source 101 is a beam source that irradiates a sample 105 with a primary electron beam 102 accelerated by a predetermined acceleration voltage.

The objective lens 103 is a focusing lens for focusing the primary electron beam 102 on a surface of the sample 105. In many cases, a magnetic pole lens having a coil and magnetic poles is used as the objective lens 103.

The deflector 104 is a coil or an electrode that generates a magnetic field or an electric field for deflecting the primary electron beam 102. By deflecting the primary electron beam 102, the surface of the sample 105 is scanned with the primary electron beam 102, and an inclination angle of the primary electron beam 102 incident on the sample is changed. A straight line that connects the electron beam source 101 and a center of the objective lens 103 is referred to as an optical axis 121, and the primary electron beam 102 not deflected by the deflector 104 irradiates the sample 105 along the optical axis 121.

The movable stage 106 holds the sample 105 and moves the sample 105 in the X direction and the Y direction.

The detector 112 detects a secondary electron 108 emitted from the sample 105 irradiated with the primary electron beam 102. The detector 112 uses an E-T detector or a semiconductor detector, in which the E-T detector includes a scintillator, a light guide, and a photomultiplier tube. A detection signal output from the detector 112 is transmitted to the image generation unit 115 via the control unit 119.

The image generation unit 115 is a calculator that generates an observation image based on the detection signal output from the detector 112, for example, a micro processing unit (MPU) or a graphics processing unit (GPU). The image generation unit 115 may perform various types of image processing on the generated observation image.

The input and output unit 116 is a device that inputs an observation condition for observing the sample 105 and displays an image generated by the image generation unit 115, for example, a keyboard, a mouse, a touch panel, or a liquid crystal display.

The storage unit 117 is a device that stores various types of data and programs, for example, a hard disk drive (HDD) or a solid state drive (SSD). The storage unit 117 stores programs executed by the control unit 119 and the like, observation conditions input from the input and output unit 116, and images generated by the image generation unit 115, and the like.

The control unit 119 is a calculator that controls each unit and processes and transmits data generated by each unit, for example, a central processing unit (CPU) or an MPU.

Figure 2:
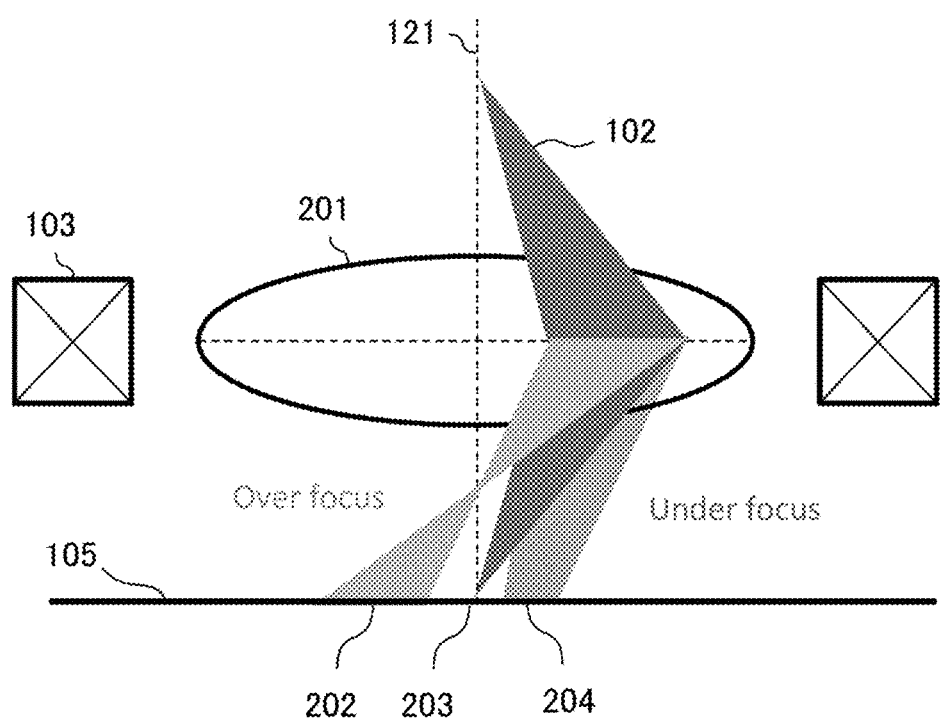
FIG. 2 is a diagram showing movement of a visual field when an electron beam is inclined.

Movement of a visual field when the primary electron beam 102 is inclined will be described with reference to FIG. 2. The primary electron beam 102 inclined by the deflector 104 reaches the sample 105 in a manner away from the optical axis 121 without passing through the center of the objective lens 103. Therefore, when the lens strength of the objective lens 103, that is, a strength of an objective lens magnetic field 201 is changed, not only a beam diameter of the primary electron beam 102 is changed, but also a position reaching the sample 105, that is, a visual field position is changed. As an example of the primary electron beam 102 focused by different lens strengths, FIG. 2 shows a just-focus visual field position 203, an over-focus visual field position 202, and an under-focus visual field position 204. An autofocus function of automatically focusing uses an evaluation value obtained from the observation image, and thus a visual field movement associated with an off-axis movement of the primary electron beam 102 has an adverse influence on the focusing.

Figure 3:
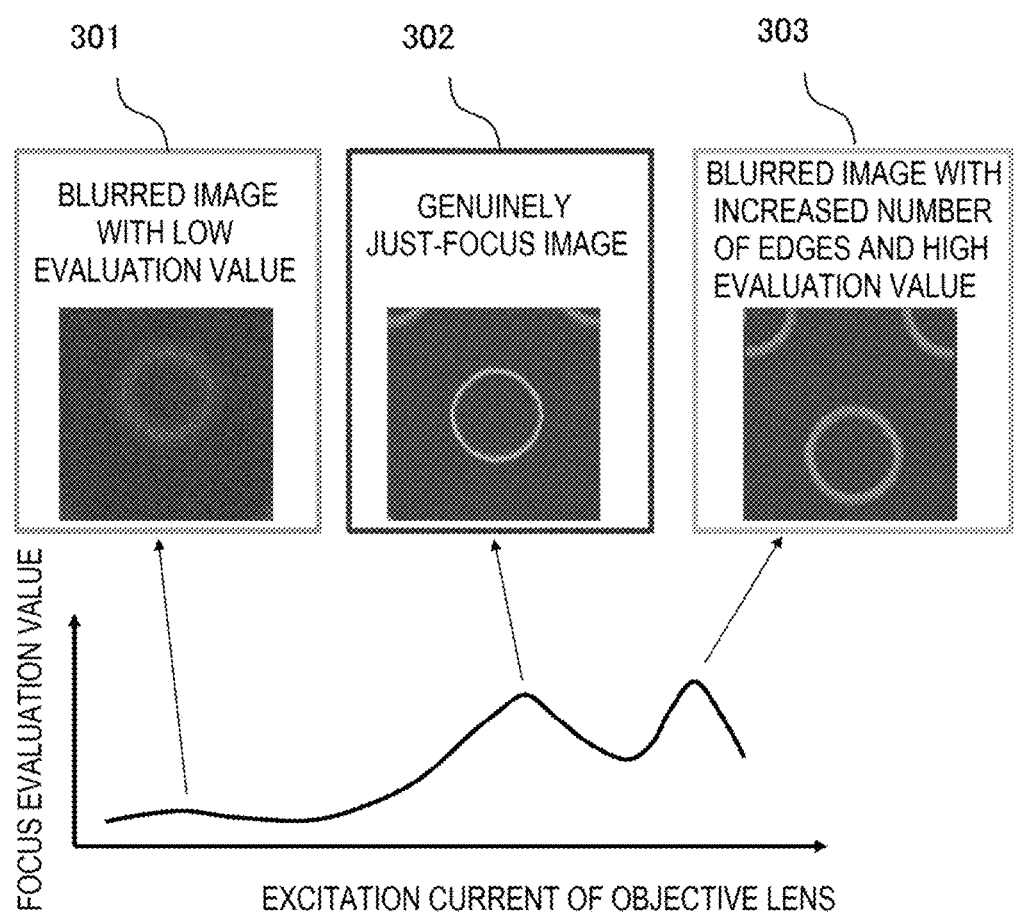
FIG. 3 is a diagram showing an example of a relationship between an excitation current of an objective lens and a focus evaluation value.

A relationship between an excitation current of the objective lens 103 and a focus evaluation value when the primary electron beam 102 moves away from the axis will be described with reference to FIG. 3. FIG. 3 illustrates observation images corresponding to the excitation current of the objective lens 103 together with a graph in which a horizontal axis represents the excitation current of the objective lens 103, that is, the lens strength, and a vertical axis represents the focus evaluation value indicating sharpness of the observation image. The observation images illustrated in FIG. 3 are obtained by imaging the sample having a plurality of annular protrusions. The focus evaluation value is obtained by averaging all pixel values of the spatial differential image calculated from the observation image. When focusing is achieved, edges of the protrusions become clear, and thus the focus evaluation value indicating the sharpness of the observation image is improved.

However, in a case where the visual field movement associated with the off-axis movement of the primary electron beam 102 occurs, the focus evaluation value may not be appropriately calculated. In FIG. 3, a first image 301 is blurred so that the evaluation value is low, and a second image 302 is focused so that the evaluation value is improved. On the contrary, a third image 303 is blurred, but has an increased number of edges other than a focus target due to the visual field movement, and thus has a high evaluation value, which, however, does not indicate appropriate focusing. An amount of visual field movement increases as an off-axis amount, which is an amount of the primary electron beam 102 moving away from the center of the objective lens 103, increases in accordance with the inclination angle. On the other hand, in the first embodiment, even when the primary electron beam 102 as a charged particle beam has a large off-axis amount, focusing with high accuracy can be achieved.

An example of a processing flow according to the first embodiment will be described step by step with reference to FIG. 4.

(S401)

The control unit 119 acquires the inclination angle of the primary electron beam 102 from the observation condition. The observation condition is input from the input and output unit 116 by an operator, or a condition selected from a plurality of observation conditions stored in advance in the storage unit 117 is read.

(S402)

The control unit 119 acquires a change amount of the visual field movement amount with respect to a change amount of the lens strength based on the inclination angle acquired in S401. For example, a relationship between the lens strength and the visual field movement amount stored in advance in the storage unit 117 is read.

Figure 5:
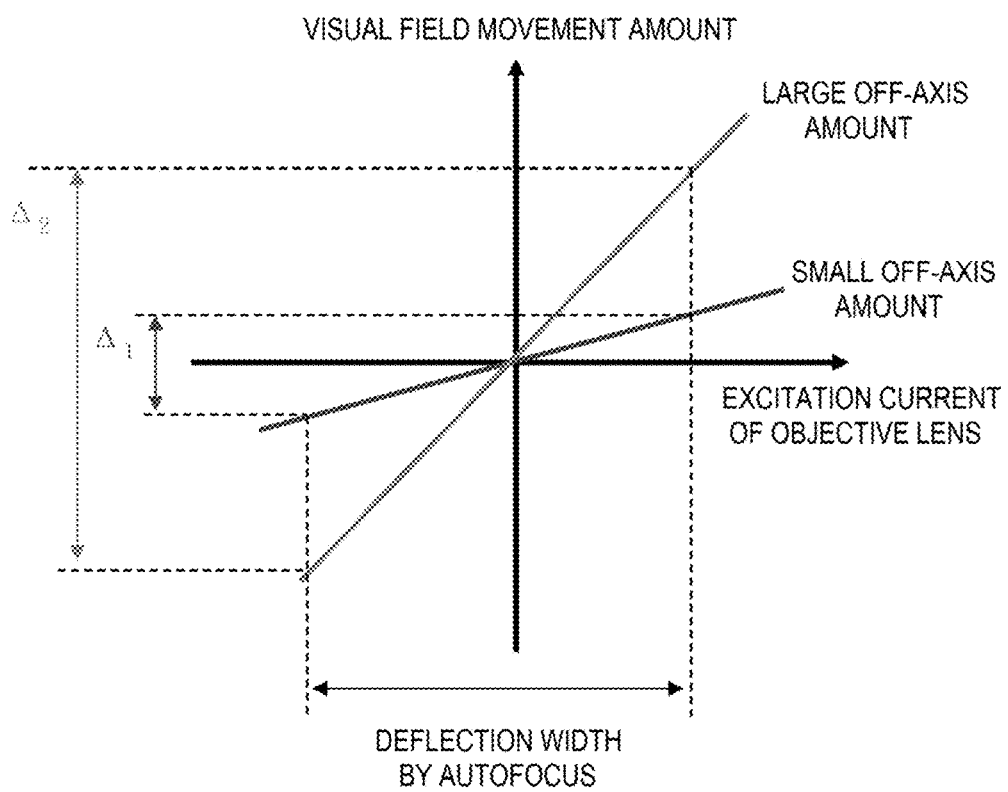
FIG. 5 is a diagram showing an example of a relationship between the excitation current of an objective lens and a visual field movement amount.

An example of the relationship between the lens strength and the visual field movement amount will be described with reference to FIG. 5. In a graph of FIG. 5, the horizontal axis represents the excitation current corresponding to the lens strength of the objective lens 103, and the vertical axis represents the visual field movement amount. The graph illustrated in FIG. 5 is created by measuring a visual field movement amount from an observation image of a sample having a known shape imaged while changing the lens strength and the off-axis amount, and is stored in advance in the storage unit 117. An inclination of a straight line in the graph of FIG. 5, which is the change amount of the visual field movement amount with respect to the change amount of the lens strength, increases as the off-axis amount predetermined by the inclination angle of the primary electron beam 102 increases. That is, as illustrated in FIG. 5, even if a variation of the lens strength by the autofocus is the same, a width $\Delta_2$ of the visual field movement amount when the off-axis amount is large is larger than a width $\Delta_1$ of the visual field movement amount when the off-axis amount is small.

In an image for creating the graph illustrated in FIG. 5, it is desirable to use a sample having a protrusion with a shape with which a direction of visual field movement is easily specified, for example, an annular shape or a cross shape. In addition, if the number of the protrusions is singular, the movement of the protrusions can be easily confirmed, and thus the visual field movement amount can be easily measured. If there are a plurality of protrusions, the protrusions can be easily captured in the visual field, and thus an imaging time can be shortened.

(S403)

The control unit 119 calculates the visual field movement amount with respect to the lens strength using the relationship acquired in S402. That is, the visual field movement amount is calculated based on the relationship illustrated in FIG. 5 between the lens strength adjusted by the autofocus and the off-axis amount predetermined by the inclination angle of the primary electron beam 102.

(S404)

The control unit 119 sets an image filter to be superimposed on the observation image based on the visual field movement amount calculated in S403. By superimposing the image filter on the observation image, the influence of the visual field movement amount is reduced, and the focus evaluation value is appropriately calculated.

Figure 6:
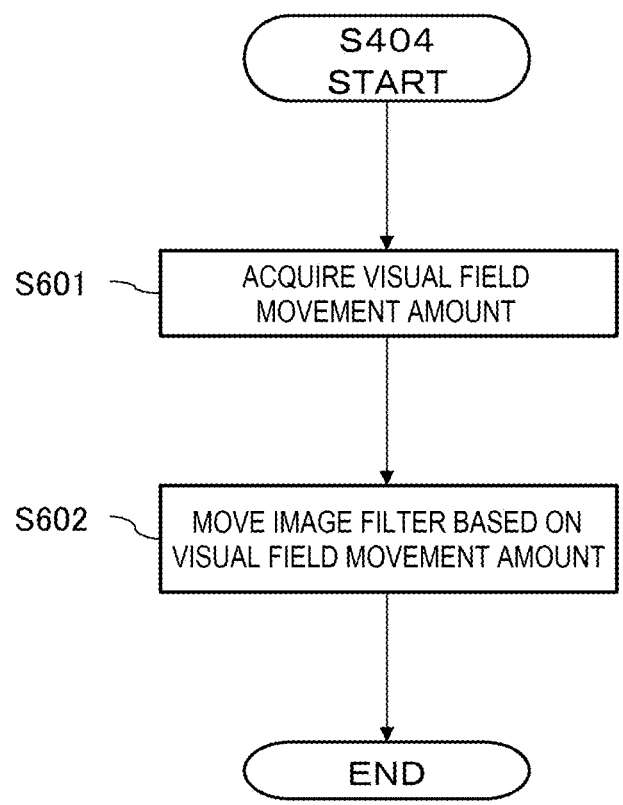
FIG. 6 is a diagram showing an example of a processing flow of setting an image filter according to the first embodiment.

An example of a processing flow of setting an image filter according to the first embodiment will be described with reference to FIG. 6.

(S601)

The control unit 119 acquires the visual field movement amount.

(S602)

The control unit 119 moves a position of the image filter to be superimposed on the observation image based on the visual field movement amount acquired in S601. The image filter is a function that shows a maximum value of 1 at a center of the observation image and has a symmetric shape with a line passing through the center as a symmetric axis, for example, a rectangular function or a Gaussian function. A width of the image filter, that is, a width of the rectangular function or a half-value width of the Gaussian function may be any value.

The position of the image filter is moved by the same amount as the visual field movement amount. When the image filter protrudes from a region of the observation image due to movement, it is preferable that the width of the image filter is narrowed so as not to protrude. For example, in a case where a length of one side of the observation image is A, the visual field movement amount is $\Delta$, and the image filter is a rectangular function having a width w, when $\Delta > (A-w)/2$, the width of the rectangular function is set to $A-2\Delta$ since the image filter protrudes from the region of the observation image when moving by $\Delta$.

Figure 7:
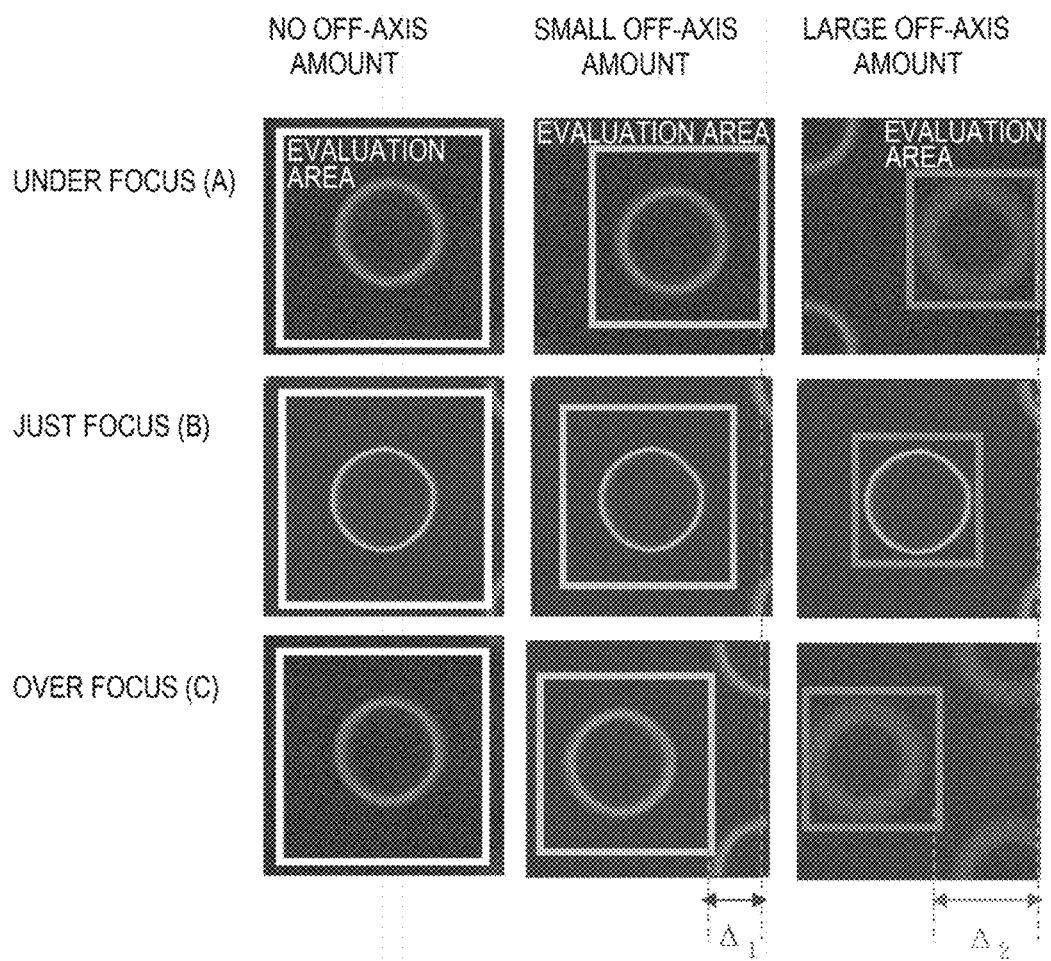
FIG. 7 is a diagram showing the image filter according to the first embodiment.

An example of the image filter according to the first embodiment will be described with reference to FIG. 7. FIG. 7 shows observation images obtained via under focus, just focus, and over focus in a case without off-axis movement, a case where the off-axis movement is small, and a case where the off-axis movement is large respectively. In each observation image, an evaluation area corresponding to an image filter of a rectangular function is shown.

In the case without off-axis movement, the visual field does not move even if the focus changes, and thus the evaluation area corresponding to the image filter also does not move. On the other hand, in the case with an off-axis movement, the visual field moves as the focus changes, and thus the evaluation area also moves. Compared to the case where the off-axis movement is small, in the case where the off-axis movement is large, the visual field movement amount becomes larger, and thus a movement amount of the evaluation area also becomes larger. Further, since the evaluation area protrudes from the observation image due to movement, the evaluation area is narrowed according to the visual field movement amount. That is, compared to the case where the off-axis movement is small, the evaluation area becomes smaller in the case where the off-axis movement is large.

Figure 4:
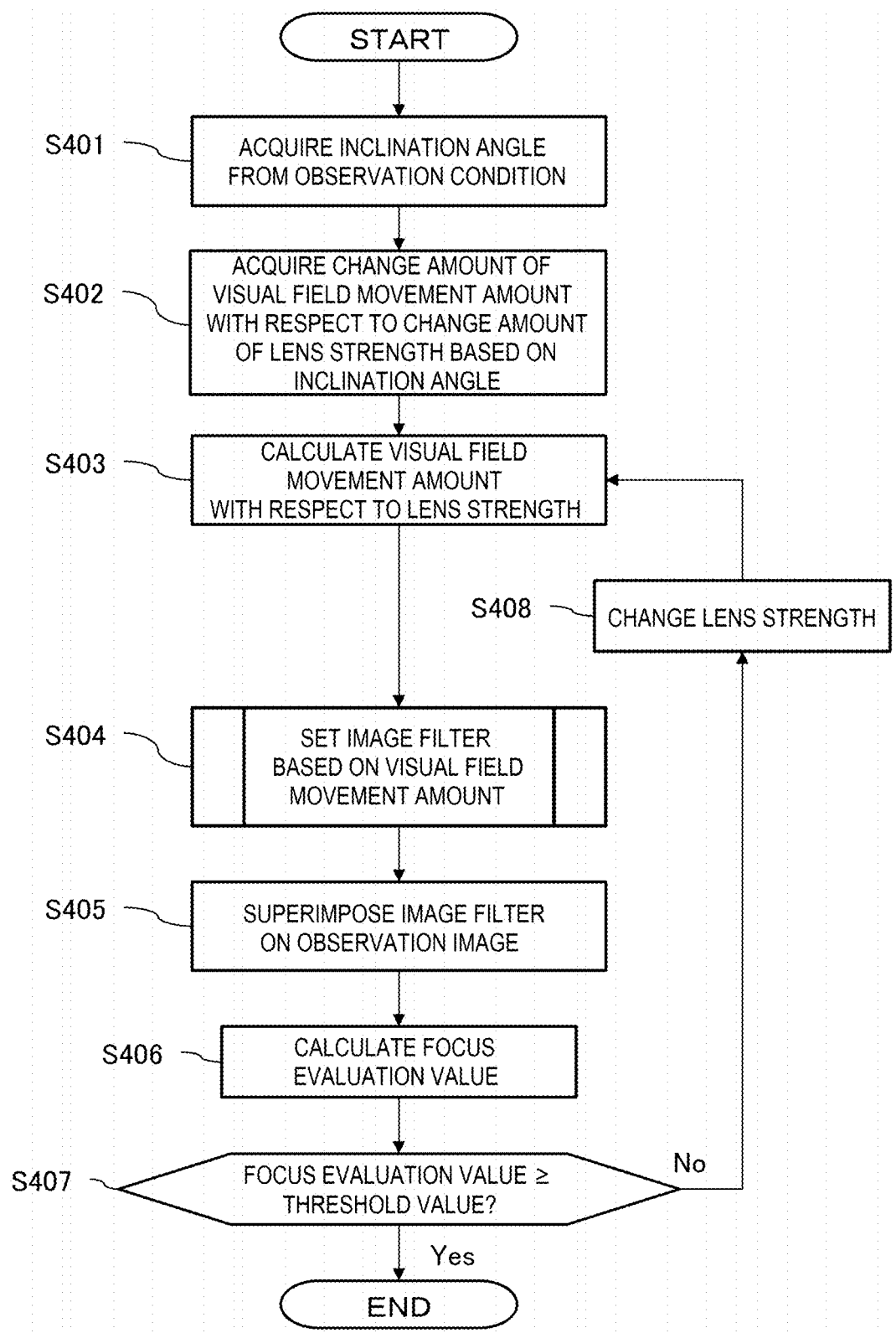
FIG. 4 is a diagram showing an example of a processing flow according to the first embodiment.

The description returns to FIG. 4.

(S405)

The control unit 119 or the image generation unit 115 superimposes the image filter set in S404 on the observation image to generate a superimposed image. For example, when an image filter of a rectangular function is superimposed on each observation image illustrated in FIG. 7, each pixel value in the evaluation area is extracted to generate a superimposed image.

(S406)

The control unit 119 calculates a focus evaluation value using the superimposed image generated in S405. For example, a differential image of the superimposed image is generated, and an average value of all pixel values of the generated differential image is calculated as the focus evaluation value.

(S407)

The control unit 119 determines whether or not the focus evaluation value calculated in S406 is equal to or greater than a predetermined threshold value. The threshold value is a reference value for determining that focusing is achieved. If the focus evaluation value is equal to or greater than the threshold value, the processing flow ends. If the focus evaluation value is less than the threshold value, the processing returns to S403 via S408.

(S408)

The control unit 119 changes the lens strength. The processing from S408 to S406 is repeated until the focus evaluation value becomes equal to or greater than the threshold value in S407. That is, the lens strength is automatically adjusted until focusing is achieved, and focusing is achieved with high accuracy.

According to the processing flow described above, even in a case where the visual field is moved by the primary electron beam 102, which is a charged particle beam, being inclined and moving away from the center of the objective lens 103, focusing is appropriately achieved. That is, even when the primary electron beam 102 has a large off-axis amount, the focus evaluation value is calculated using the superimposed image generated by superimposing the image filter, which reduces the influence of the visual field movement caused by the off-axis movement, on the observation image, and thus it is possible to achieve focusing with high accuracy.

Second Embodiment

As described in the first embodiment, the focus evaluation value is calculated using the image filter in which the position is moved based on the visual field movement amount. The image filter used for calculation of the focus evaluation value is not limited to one with a moved position. In the second embodiment, an image filter whose size is changed based on the visual field movement amount will be described. Since some of the configurations and functions described in the first embodiment can be applied to the second embodiment, the same reference numerals are used for the same configurations and functions, and the description thereof will be omitted. That is, the processing flow of the second embodiment is substantially the same as that of the first embodiment, and only the image filter setting processing in S404 is different, so that S404 will be described.

Figure 8:
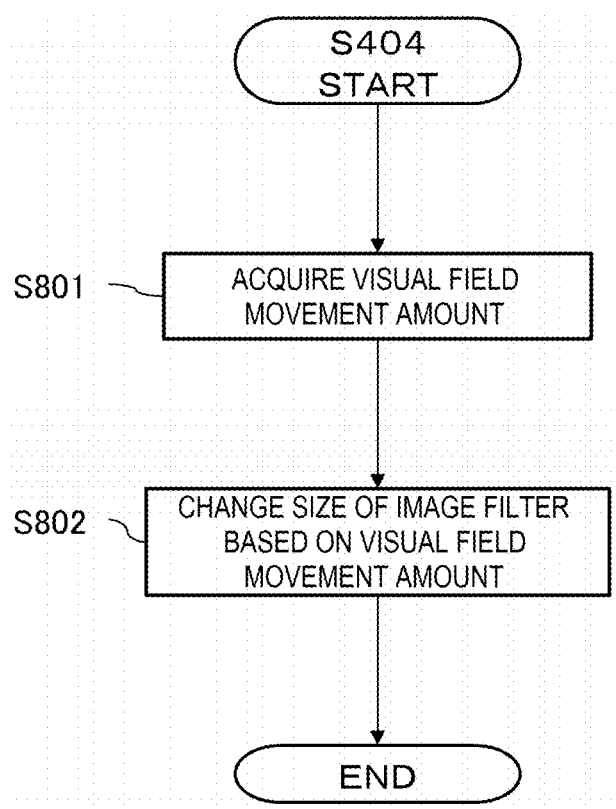
FIG. 8 is a diagram showing an example of a processing flow of setting an image filter according to a second embodiment.

An example of a processing flow of setting an image filter according to the second embodiment will be described with reference to FIG. 8.

(S801)

The control unit 119 acquires the visual field movement amount.

(S802)

The control unit 119 changes the size of the image filter to be superimposed on the observation image based on the visual field movement amount acquired in S801. The image filter is a function that shows a maximum value of 1 at the center of the observation image and has a symmetric shape with a line passing through the center as a symmetric axis, for example, a function approximated to a trapezoidal shape or a Gaussian function. In addition, the position of the image filter is fixed at the center of the observation image. The size of the image filter, that is, a half-value width of the image filter or the like is narrowed as the visual field movement amount increases.

An example of the image filter according to the second embodiment will be described with reference to FIG. 9. FIG. 9 illustrates a window function, which is the image filter, together with observation images obtained via under focus, just focus, and over focus in a case without off-axis movement and a case where the off-axis movement is large respectively.

In the case without off-axis movement, the visual field does not move even if the focus changes, and thus the size of the image filter remains large. On the other hand, in the case with an off-axis movement, the visual field moves as the focus changes, and an edge marked with an arrow is included in the observation image. As described with reference to FIG. 2, since appropriate focusing is not achieved when the number of edges other than the focus target is large, the size of the image filter is narrowed so that the pixel values outside a central portion of the observation image are not used to calculate the focus evaluation value in the second embodiment.

According to the processing flow described above, the size of the image filter is changed based on the visual field movement amount. The image filter having a changed size is used to generate a superimposed image in S405. The superimposed image generated in S405 is used to calculate the focus evaluation value in S406. As a result, since the focus evaluation value is appropriately calculated, focusing with high accuracy becomes possible.

A plurality of embodiments of the invention have been described above. The invention is not limited to the above embodiments, and constituent elements may be modified and embodied without departing from the spirit of the invention. In addition, a plurality of constituent elements disclosed in the above embodiments may be appropriately combined. Furthermore, some constituent elements may be deleted from all the constituent elements shown in the above embodiments.

What is claimed is:

1. A charged particle beam device that generates an observation image of a sample by irradiating the sample with a charged particle beam, the charged particle beam device comprising:
    a deflection unit that inclines the charged particle beam;
    a focusing lens that focuses the charged particle beam;
    an adjustment unit that adjusts a lens strength of the focusing lens based on an evaluation value calculated from the observation image;
    a storage unit that stores a relationship between a visual field movement amount, which is an amount of movement of the charged particle beam on the sample for each off-axis amount that is an amount of the charged particle beam moving away from a center of the focusing lens, and the lens strength; and
    a filter setting unit that calculates the visual field movement amount based on an inclination angle of the charged particle beam and the relationship, and sets an image filter to be superimposed on the observation image based on the calculated visual field movement amount, wherein
    the evaluation value is calculated from a superimposed image obtained by superimposing the image filter on the observation image.

2. The charged particle beam device according to claim 1, wherein
    the filter setting unit sets a position of the image filter based on the visual field movement amount.

3. The charged particle beam device according to claim 2, wherein
    when the image filter protrudes from a region of the observation image, the filter setting unit narrows a width of the image filter.

4. The charged particle beam device according to claim 3, wherein
    when the image filter is a rectangular function, a length of one side of the observation image is A, and the visual field movement amount is $\Delta$, the filter setting unit sets the width of the image filter to be A$-2\Delta$.

5. The charged particle beam device according to claim 1, wherein
    the filter setting unit sets a size of the image filter based on the visual field movement amount.

6. The charged particle beam device according to claim 1, wherein
    the relationship is created by measuring a visual field movement amount from an observation image of a known sample, which is a sample having a known shape, imaged while changing a lens strength and an off-axis amount.

7. The charged particle beam device according to claim 6, wherein
    the known sample has a protrusion in an annular shape or a cross shape.

* * * * *